United States Patent
Kim et al.

(10) Patent No.: US 7,172,967 B2
(45) Date of Patent: Feb. 6, 2007

(54) METHODS FOR FORMING COBALT LAYERS INCLUDING INTRODUCING VAPORIZED COBALT PRECURSORS AND METHODS FOR MANUFACTURING SEMICONDUCTOR DEVICES USING THE SAME

(75) Inventors: Hyun-Su Kim, Gyeonggi-do (KR); Gil-Heyun Choi, Gyeonggi-do (KR); Sang-Bom Kang, Seoul (KR); Woong-Hee Sohn, Gyeonggi-do (KR); Jong-Ho Yun, Gyeonggi-do (KR); Kwang-Jin Moon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/924,034

(22) Filed: Aug. 23, 2004

(65) Prior Publication Data
US 2005/0064706 A1    Mar. 24, 2005

(30) Foreign Application Priority Data
Sep. 22, 2003    (KR) .................. 10-2003-0065572

(51) Int. Cl.
*H01L 21/44*    (2006.01)
(52) U.S. Cl. ............... 438/682; 438/664; 438/762; 438/765; 257/E21.199; 257/E21.622; 257/E21.636
(58) Field of Classification Search ........... 438/682, 438/762, 765, 664, 681, FOR. 405; 257/E21.199, 257/E21.622, E21.636
See application file for complete search history.

(56) References Cited

U.S. PATENT DOCUMENTS

| | | | |
|---|---|---|---|
| 4,814,294 A * | 3/1989 | West et al. | ............ 438/606 |
| 5,529,958 A | 6/1996 | Yaoita | |
| 6,346,477 B1 | 2/2002 | Kaloyeros et al. | |
| 2002/0036353 A1 | 3/2002 | Song et al. | |

FOREIGN PATENT DOCUMENTS

| | | |
|---|---|---|
| JP | 7-86559 A | 3/1995 |
| KR | 10-0343653 B1 | 6/2002 |
| KR | 10-0349625 B1 | 8/2002 |

OTHER PUBLICATIONS

Notice to Submit Response, Korean App. 10-2003-0065572, May 25, 2005.

* cited by examiner

*Primary Examiner*—Michelle Estrada
(74) *Attorney, Agent, or Firm*—Myers Bigel Sibley & Sajovec, P.A.

(57) ABSTRACT

The present invention provides methods for forming cobalt silicide layers, including introducing a vaporized cobalt precursor onto a silicon substrate to form a cobalt layer. The vaporized cobalt precursor has the formula $Co_2(CO)_6(R^1-C{\equiv}C-R^2)$, wherein $R^1$ is H or $CH_3$, and $R^2$ is H, t-butyl, methyl or ethyl. The silicon substrate is thermally treated so that silicon is reacted with cobalt to form a cobalt silicide layer. Methods for manufacturing semiconductor devices including the cobalt silicide layers described herein and such devices are also provided.

22 Claims, 8 Drawing Sheets

METHODS FOR FORMING COBALT LAYERS INCLUDING INTRODUCING VAPORIZED COBALT PRECURSORS AND METHODS FOR MANUFACTURING SEMICONDUCTOR DEVICES USING THE SAME

RELATED APPLICATION DATA

This application claims the priority of Korean Patent Application No. 2003-65572, filed on Sep. 22, 2003, the disclosure of which is incorporated herein by reference in its entirety as if set forth fully herein.

FIELD OF THE INVENTION

The present invention relates to methods of forming cobalt layers and methods for manufacturing semiconductor devices using the same. More particularly, the present invention relates to methods of forming cobalt layers using vaporized cobalt precursors as a source.

BACKGROUND OF THE INVENTION

As an information-oriented society has rapidly developed, semiconductor devices capable of rapidly transmitting data to quickly process massive information may be desired. However, when semiconductor devices become highly integrated, the semiconductor devices may have unsuitable characteristics. For example, the length of a gate electrode and the junction depth of source/drain regions can be reduced. Such scaling down of these regions can increase the resistance of a semiconductor device. As a result, it can be difficult to operate the semiconductor device at a high speed and power consumption can increase.

To address these concerns, a method for forming a metal silicide layer comprising metal and silicon on the gate and the source/drain regions can be used. Examples of the metal silicide layer include, but are not limited to, a tungsten silicide layer, a titanium silicide layer, and a cobalt silicide layer. These metal silicide layers may be used alone or in a mixture thereof. Since the cobalt silicide layer can exhibit a low resistance, a low consumption of silicon and a high thermal and chemical stability, cobalt silicide layers have been used in highly-integrated semiconductor devices.

A conventional method of forming a metal silicide layer includes depositing cobalt on a silicon substrate by a physical vapor deposition (PVD) process to form a cobalt layer. The silicon substrate is thermally treated so that cobalt is reacted with silicon to form a cobalt silicide layer. A cobalt silicide target is sputtered in the PVD process to provide a cobalt silicide layer including a reduced degree of impurities. Accordingly, the cobalt silicide layer formed by the PVD process can exhibit a substantial similarity to pure cobalt. Further, the cobalt silicide layer formed by silicidating the cobalt layer can possess a low resistance.

The cobalt silicide layer formed by the PVD process, however, has relatively poor step coverage in view of the process characteristics. Under these conditions, the cobalt layer may not be formed with a uniform thickness. Thus, uniformly forming a cobalt layer on a minute and irregular pattern may be problematic. Since the cobalt layer may typically be formed on the minute and irregular pattern and an inner wall of a contact hole, the PVD process may be less effective for forming the desired cobalt layer.

Moreover, when the cobalt layer has an irregular thickness, the cobalt silicide layer formed from the cobalt layer may also have an irregular thickness so that semiconductor devices on the substrate have various operation characteristics, which can negatively affect reliability of the semiconductor device.

Methods for forming a cobalt layer having improved step coverage have been suggested. For example, the cobalt layer can be formed by a chemical vapor deposition (CVD) process or an atomic layer deposition (ALD) process.

However, precursors for forming the cobalt layer may include carbon or oxygen as well as cobalt. Thus, the cobalt layer formed by the CVD process or the ALD process can include an increased quantity of impurities compared to that formed by the PVD process. The cobalt layer having an increased quantity of impurities may possess a relatively high resistance so that the CVD process and the ALD process, in addition to the PVD process, may be less effective for forming the desired cobalt layer.

Additionally, oxygen present in the precursor, and other oxygen products created in the CVD process, can be reacted with silicon to oxidize a surface of the silicon substrate, thereby forming an oxide layer at an interface between the surface of the silicon substrate and the cobalt layer. The oxide layer can suppress a reaction between cobalt and silicon in a subsequent silicidation process. Consequently, a cobalt silicide layer may not be formed.

SUMMARY OF THE INVENTION

Embodiments of the present invention provide methods for forming cobalt silicide layers capable of having improved step coverage and/or suppressing the formation of an oxide layer at an interface between a silicon substrate and the cobalt silicide layer to provide a desired cobalt silicide layer.

In some embodiments, the present invention provides methods of forming cobalt silicide layers including introducing a vaporized cobalt precursor having the formula $Co_2(CO)_6(R^1—C≡C—R^2)$, wherein $R^1$ is H or $CH_3$, and $R^2$ is H, t-butyl, methyl or ethyl, onto a silicon substrate as a source gas to form a cobalt layer on the silicon substrate, forming a titanium layer on the cobalt layer and thermally treating the silicon substrate to react silicon with cobalt to form the cobalt silicide ($CoSi_2$) layer. A gate structure having a gate oxide layer pattern and a polysilicon layer pattern formed on the gate oxide layer pattern can be formed on the silicon substrate, a nitride spacer can be formed on a sidewall of the gate structure, and source/drain regions can be formed at surface portions of the silicon substrate that are positioned at both sides of the gate structure prior to introduction of the vaporized cobalt precursor.

In other embodiments of the present invention, methods are provided for manufacturing semiconductor devices including forming a gate structure including a gate oxide layer pattern and a polysilicon layer pattern on a silicon substrate, forming a nitride spacer on a sidewall of the gate structure, forming source/drain regions at surface portions of the silicon substrate that are positioned at both sides of the gate structure, introducing a vaporized cobalt precursor having the formula $Co_2(CO)_6(R^1—C≡C—R^2)$, wherein $R^1$ is H or $CH_3$, and $R^2$ is H, t-butyl, methyl or ethyl, onto the silicon substrate to form a cobalt layer on a native oxide layer that is naturally formed on the silicon substrate, forming a titanium layer on the cobalt layer and thermally treating the silicon substrate to diffuse titanium into the native oxide layer to reduce the native oxide layer and/or to react silicon with cobalt to form a cobalt silicide layer on the gate structure and the source/drain regions.

In further embodiments, the present invention provides method for manufacturing a semiconductor device including forming a polysilicon layer on a silicon substrate, forming an insulating interlayer on the polysilicon layer, etching the insulating interlayer to form a contact hole partially exposing the polysilicon layer, introducing a vaporized cobalt precursor having the formula $Co_2(CO)_6(R^1-C{\equiv}C-R^2)$, wherein $R^1$ is H or $CH_3$, and $R^2$ is H, t-butyl, methyl or ethyl, onto the silicon substrate to form a cobalt layer on a native oxide layer that is naturally formed on the silicon substrate, forming a titanium layer on the cobalt layer and thermally treating the silicon substrate to diffuse titanium into the native oxide layer to reduce the native oxide layer and/or to diffuse titanium into the interface between the native oxide layer and the silicon substrate to promote a reaction between silicon and cobalt to form a cobalt silicide layer.

In still further embodiments, the present invention provides semiconductor devices including the cobalt silicide layers provided herein.

BRIEF DESCRIPTION OF THE DRAWINGS

Some of the features and advantages of the present invention will become more apparent through reference to the following detailed description when considered in conjunction with the accompanying drawings wherein.

DETAILED DESCRIPTION OF EMBODIMENTS ACCORDING TO THE INVENTION

Figure 1A:
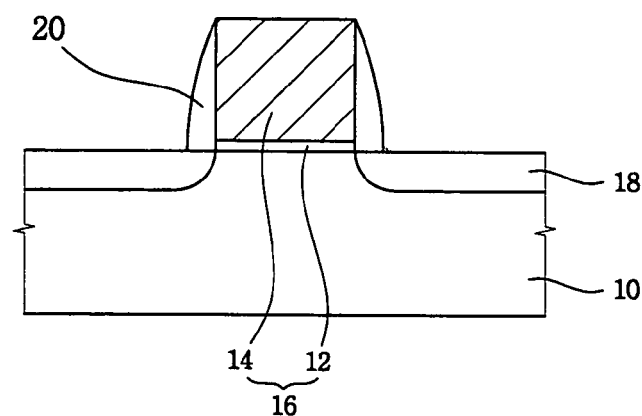
FIGS. 1A to 1F present cross sectional views illustrating a method for manufacturing a semiconductor device in accordance with an embodiment of the present invention as presented in Example 1.

The present invention now will be described more fully hereinafter with reference to the accompanying drawings, in which some embodiments of the present invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of embodiments according to the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise.

Unless otherwise defined, all terms, including technical and scientific terms used in the description of the invention, have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Also, the methods described herein may comprise, consist essentially of and/or consist of the stated features, steps, operations, elements, and/or components described herein.

Moreover, it will be understood that steps comprising the methods provided herein can be performed independently or at least two steps can be combined when the desired outcome can be obtained. Additionally, steps comprising the methods provided herein, when performed independently or combined, can be performed at the same temperature or at different temperatures without departing from the teachings of the present invention.

In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

As will be appreciated by one of ordinary skill in the art, the present invention may be embodied as compositions and devices as well as methods of making and using such compositions and devices.

As used herein, "cobalt layer" refers to a layer comprising, consisting essentially of or consisting of cobalt. Examples of cobalt layers include, but are not limited to, layers comprising, consisting essentially of or consisting of cobalt, cobalt silicide and the like. The semiconductor substrates described herein can include silicon or a derivative thereof. For example, the semiconductor substrates can include tungsten silicide, titanium silicide, cobalt silicide or a combination thereof.

In particular embodiments of the present invention, a silicon substrate on which patterns can be partially formed is loaded into a chamber. An exposed surface of the silicon substrate is a region on which the silicide layer is formed. For example, the region includes exposed surfaces of the silicon substrate such as upper surfaces of source/drain regions and the exposed surfaces of a polysilicon layer such as those on polysilicon pattern of a gate line or bit line.

The cobalt precursor as a source used for forming the cobalt layer is heated to form a vaporized cobalt precursor. The cobalt precursor can stably exist in a liquefied state at a room temperature. The liquefied cobalt precursor can be readily treated. Exemplary cobalt precursors include, but are not limited to, $Co_2(CO)_6$:(HC≡CtBu), $Co(MeCp)_2$, $Co(CO)_3(NO)$, $Co(CO)_2Cp$ (wherein Cp represents cyclopentadienyl group), $CoCp_2$, $Co_2(CO)_6$:(HC≡CPh), $Co_2(CO)_6$:(HC≡CH), $Co_2(CO)_6$:(HC≡CCH_3$), $Co_2(CO)_6$:$(CH_3C≡CCH_3)$. The cobalt precursor can be used alone or in a mixture thereof, i.e., in combination with other exemplary cobalt precursors. In some embodiments, the cobalt precursor includes dicobalt hexacarbonyl t-butyl acetylene [$Co_2(CO)_6$:(HC≡CtBu), CCTBA].

The vaporized cobalt precursor is introduced into the chamber to form the cobalt layer. An inert gas, such as argon gas, can be used as a carrier gas for carrying the vaporized cobalt precursor into the chamber. Alternatively, the cobalt layer may be formed by a CVD process or an ALD process.

Additionally, a hydrogen gas may be introduced into the chamber together with the vaporized cobalt precursor. After the cobalt layer is formed, a plasma treatment may be performed using the hydrogen gas on the cobalt layer. In this instance, the hydrogen gas is reacted with impurities, for example carbon or oxygen, in the cobalt layer to outgas the impurities (i.e., to vent the impurities out of the chamber as a gaseous state).

The vaporized cobalt precursor introduced into the chamber can be physisorbed and chemisorbed on the silicon substrate. A purging gas is then introduced into the chamber. The physisorbed portion can be separated from the silicon substrate to leave predominantly a cobalt atomic layer on the silicon substrate. The above processes can be repeatedly carried out to form a cobalt layer having a desired thickness.

The thickness of the cobalt layer is determined in view of the thickness of the silicon substrate removed in the subsequent silicidation process. Particularly, the thickness of the cobalt layer is determined in accordance with the junction depth of the source/drain regions. In some embodiments, the cobalt layer has a relatively thin thickness sufficient to prevent the source/drain regions from being entirely consumed in the subsequent silicidation process.

A native oxide layer having a thickness of about 10 Å is naturally formed on the exposed surface of the silicon substrate in the process for forming the cobalt layer.

A titanium capping layer can be formed on the cobalt layer by a CVD process, an ALD process or a PVD process. Titanium in the titanium layer can diffuse into the native oxide layer through the cobalt layer in the silicidation process to reduce the native oxide layer. Thus, the reduced native oxide layer does not interfere with the reaction between cobalt and silicon in the silicidation process. In some embodiments, the titanium layer has a thickness of at least about 5 Å. In other embodiments, the titanium layer has a thickness of at least about 10 Å to about 15 Å. The titanium layer is removed in subsequent processes. Accordingly, an excessive thickness of the titanium layer may be prevented. The resulting titanium layer has a thickness sufficient for reducing the native oxide layer.

Additionally, a titanium nitride layer may be formed on the titanium layer. In some embodiments, the titanium nitride layer has a thickness of at least about 100 Å.

The silicon substrate can be thermally treated to form the cobalt silicide layer. The thermal treatment is carried out in an atmosphere having a temperature in a range of about 300° C. to about 1,000° C. In some embodiments, the thermal treatment is performed in a furnace or by a rapid thermal process (RTP). The thermal treatment may be repeatedly performed. In some embodiments, the thermal treatment may be performed at least twice. The titanium layer and un-reacted cobalt remaining on the silicon substrate are removed.

In further embodiments, the thermal treatment can be carried out in the following sequences. The silicon substrate is primarily thermally treated in an atmosphere having a temperature of about 300° C. to about 600° C. to convert the cobalt layer into a preliminary cobalt silicide layer by partially reacting silicon and cobalt. The titanium layer and un-reacted cobalt remaining on the silicon substrate are then removed. The cobalt layer may be removed by a wet etching process. The silicon substrate is secondarily thermally treated in an atmosphere having a temperature of about 700° C. to about 1,000° C. to thereby transform the initial cobalt silicide layer into a final cobalt silicide layer. The second cobalt silicide layer has a low resistance, improved stability and improved step coverage compared to the characteristics of the initial cobalt silicide layer.

Further embodiments of the present invention provide methods for manufacturing semiconductor devices including the cobalt silicide layers provided herein.

Embodiments of the present invention will be further explained with reference to certain examples, which are included herein for illustration purposes only, and which are not intended to be limiting of the invention.

EXAMPLE 1

FIGS. 1A to 1F present cross-sectional views illustrating methods for forming cobalt silicide layers and semiconductor devices including the cobalt silicide layers provided herein.

Referring to FIG. 1A, a silicon substrate 10 was defined into a field region and an active region by an isolation process. A silicon oxide layer having a thickness of about 15 Å was formed on the silicon substrate 10. A polysilicon layer was then formed on the silicon oxide layer. The polysilicon layer and the silicon oxide layer were patterned to form a gate structure 16 including a polysilicon layer pattern 14 and a gate oxide layer pattern 12.

Impurities were implanted into surface portions of the silicon substrate 10 exposed by the gate structure 16 to form source/drain regions 18. A silicon nitride spacer 20 was formed on a sidewall of the gate structure 16.

Figure 1B:
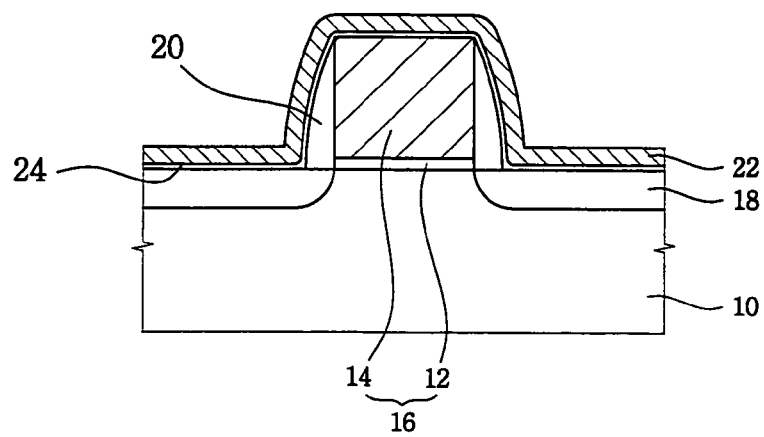

Referring to FIG. 1B, the silicon substrate 10 was wet-cleaned to remove a native oxide layer and particles formed on the silicon substrate 10. The wet cleaning process can be carried out using an aqueous hydrofluoric (HF) solution.

A cobalt layer 22 having a thickness of about 1,000 Å to about 2,000 Å was formed on the spacer 20 and the gate structure 16. The cobalt layer 22 can be formed by a CVD process. A process for forming the cobalt layer 22 by the CVD process is further discussed below.

A cobalt precursor as a source used for forming the cobalt layer 22 was heated to form a vaporized cobalt precursor. Exemplary cobalt precursors include, but are not limited to, $Co_2(CO)_6$:(HC≡CtBu), $Co(MeCp)_2$ (wherein Cp represents a cyclopentadienyl group), $Co(CO)_3(NO)$, $Co(CO)_2Cp$, $CoCp_2$, $Co_2(CO)_6$:(HC≡CPh), $Co_2(CO)_6$:(HC≡CH), $Co_2(CO)_6$:(HC≡CCH_3)$ and $Co_2(CO)_6$:(CH_3C≡CCH_3)$. The cobalt precursors could be used alone or in a mixture thereof. A particular cobalt precursor includes dicobalt hexacarbonyl t-butyl acetylene [$Co_2(CO)_6$:(HC≡Ct—Bu), CCTBA]. Dicobalt hexacarbonyl t-butyl acetylene[$Co_2(CO)_6$:(HC≡CtBu), CCTBA] is represented by following chemical formula:

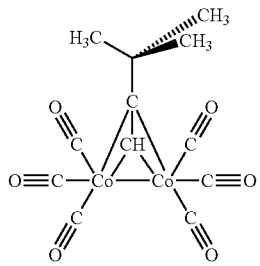

The vaporized cobalt precursor was introduced into a chamber into which the silicon substrate 10 was loaded. In this instance, an argon gas was used as a carrier gas for carrying the vaporized cobalt precursor into the chamber.

Both bonds between cobalt and carbon, and between cobalt and oxygen in the vaporized cobalt precursor introduced into the chamber were broken. Thus, cobalt was deposited on the silicon substrate 10, the spacer 20 and the gate structure 16 to form a cobalt layer 22.

The thickness of the cobalt layer 22 was determined considering a thickness of the silicon substrate 10 and removal in a subsequent silicidation process. Particularly, the thickness of the cobalt layer 22 was determined in accordance with the junction depth of the source/drain regions 18. The cobalt layer 22 had a thickness sufficient for preventing the source/drain regions 18 from being entirely consumed in a subsequent silicidation process.

The native oxide layer 24 having a thickness of about 10 Å was naturally formed on the exposed surface of the silicon substrate 10 in the process for forming the cobalt layer 22.

Figure 1C:
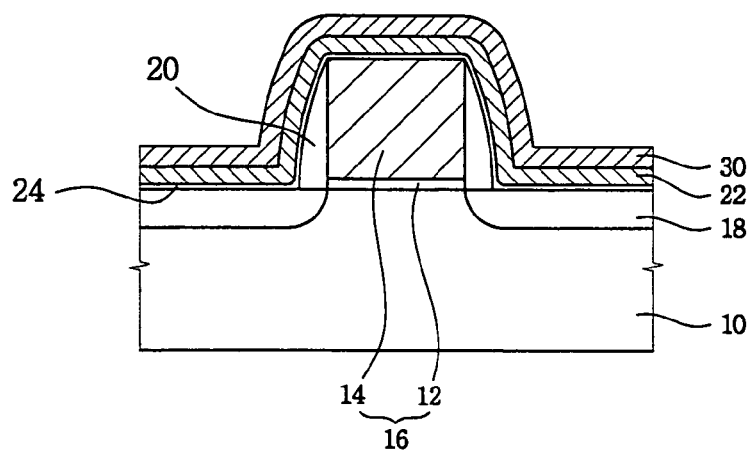

Referring to FIG. 1C, a titanium layer 30 was formed on the cobalt layer 22 by a CVD process, an ALD process or a PVD process. The titanium layer 30 had a thickness of at least about 5 Å, and in some cases, about 10 Å to about 15 Å.

Figure 1D:
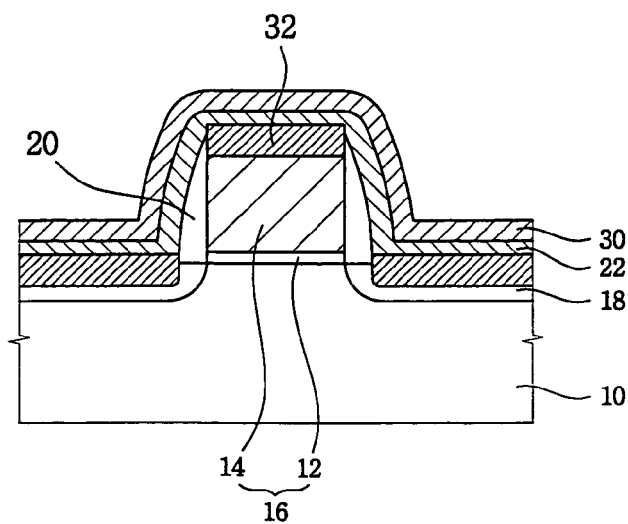

Referring to FIG. 1D, the silicon substrate 10 was primarily thermally treated in an atmosphere having a temperature in a range of about 400° C. to about 500° for a sufficient time, such as about 90 seconds. Cobalt in the cobalt layer 22 was reacted with silicon in the silicon substrate 10 to form a first cobalt silicide layer 32 on surfaces of the source/drain regions 18 and the gate structure 16. The silicon substrate 10 was primarily thermally treated in a furnace or by a rapid thermal process (RTP).

Titanium in the titanium layer 30 diffused into the interface oxide layer 24 through the cobalt layer 22 in the primary thermal treatment. Thus, the native oxide layer 24 did not interfere with the reaction between cobalt and silicon in the primary thermal treatment.

Figure 1E:
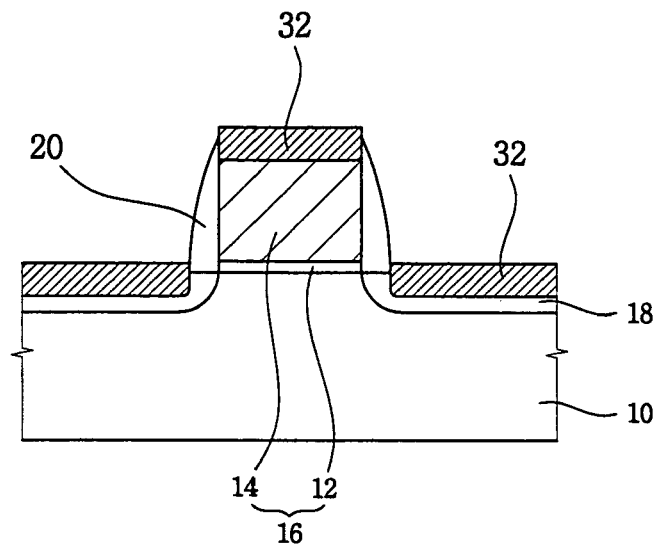

Referring to FIG. 1E, the remaining titanium layer 30 and un-reacted cobalt were wet-etched to be removed.

Figure 1F:
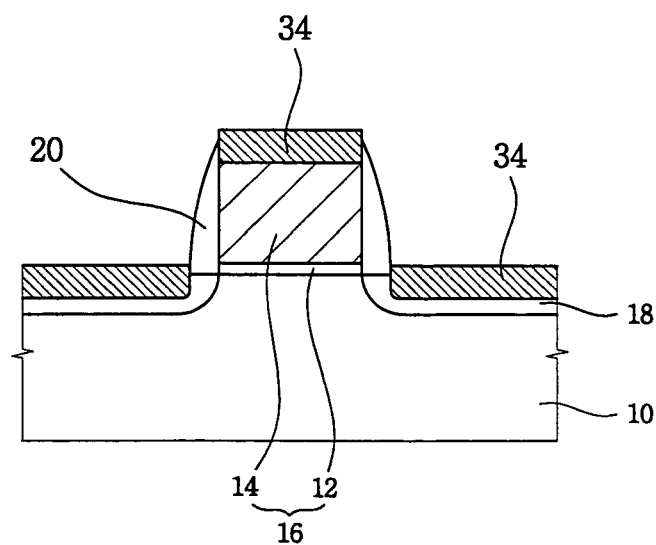

Referring to FIG. 1F, the silicon substrate 10 was secondarily thermally treated in an atmosphere having a temperature in a range of about 800° C. to about 900° C. for a sufficient time, such as 30 seconds, to transform the first cobalt silicide layer 32 into a second cobalt silicide layer 34 as a final cobalt silicide layer. The second cobalt silicide layer 34 was formed at a portion under a surface of the silicon substrate 10 as well as on the surface of the silicon substrate 10. In this instance, the second cobalt silicide layer 34 positioned at the portion under the surface of the silicon substrate 10 had a thickness less than the junction depth of the source/drain regions 18 to prevent the source/drain regions 18 from being entirely consumed in the silicidation process.

According to the present example, the second cobalt silicide layer 34 was selectively formed on the gate structure 16 and the source/drain regions 18. Since the second cobalt silicide layer 34 had a low resistance, the gate structure 16 and the source/drain regions 18 also had a low resistance. Therefore, a semiconductor device having the second cobalt silicide layer 34 may demonstrate improved performance.

EXAMPLE 2

In further methods of forming a cobalt silicide layer, a gate structure including a gate insulation layer pattern and a polysilicon layer pattern was formed on a silicon substrate. Source/drain regions were formed at surface portions of the silicon substrate at both sides of the gate structure. A silicon nitride spacer was formed on a sidewall of the gate structure.

A cobalt layer was formed on the silicon substrate and the gate structure. A cobalt precursor was vaporized and introduced onto the silicon substrate. The vaporized cobalt precursor was physisorbed and chemisorbed on the silicon substrate. A purging gas was then introduced onto the silicon substrate. The physisorbed portion was separated from the silicon substrate to leave mostly or only a cobalt atomic layer on the silicon substrate. These processes were repeatedly carried out to form the cobalt layer having a desired thickness.

EXAMPLE 3

FIGS. 2A to 2E present cross-sectional views illustrating a method for forming a cobalt silicide layer in a contact hole.

Figure 2A:
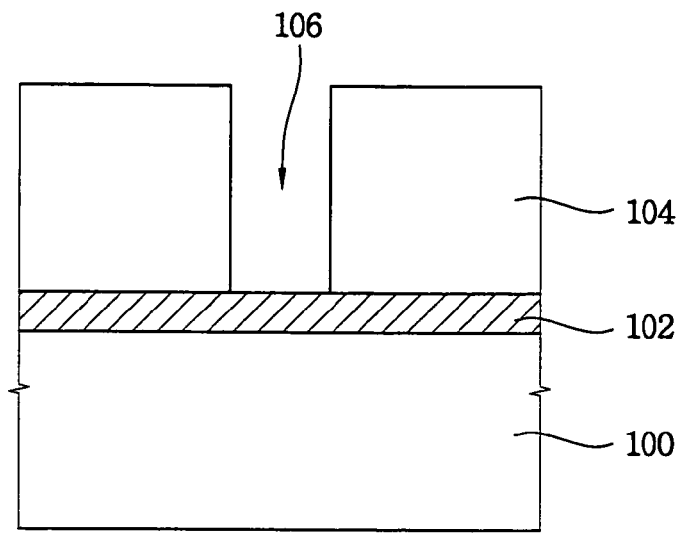
FIGS. 2A to 2E present cross sectional views illustrating a method for forming a cobalt silicide layer in a contact hole in accordance with an embodiment of the present invention as presented in Example 3.

Referring to FIG. 2A, a polysilicon layer 102 was formed on a silicon substrate 100. An insulating interlayer 104 was formed on the polysilicon layer 102. The insulating interlayer 104 was partially etched to form a contact hole 106 exposing the polysilicon layer 104. The contact hole 106 was then cleaned using plasma.

Figure 2B:
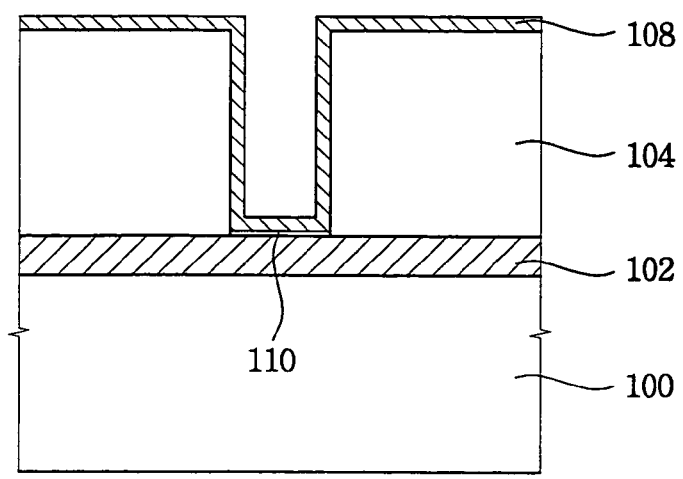

Referring to FIG. 2B, a cobalt layer 108 was formed on the insulating interlayer 104, and a side face and a bottom face of the contact hole 106. The cobalt layer 108 can be formed as described in the present examples. A native oxide layer 110 was formed on the polysilicon layer 102 exposed through the contact hole 106 in the process for forming the cobalt layer 108.

Figure 2C:
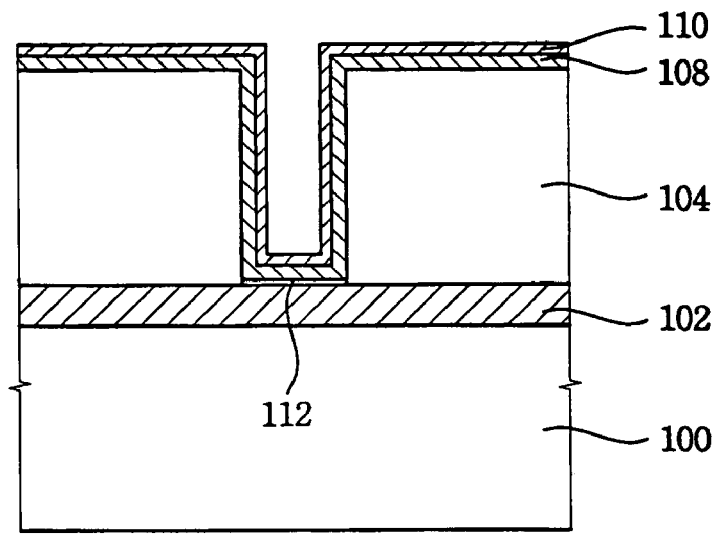

Referring to FIG. 2C, a titanium layer 112 having a thickness of at least about 5 Å was formed on the cobalt layer 108. The titanium layer 110 can be formed by a CVD process, an ALD process or a PVD process.

Figure 2D:
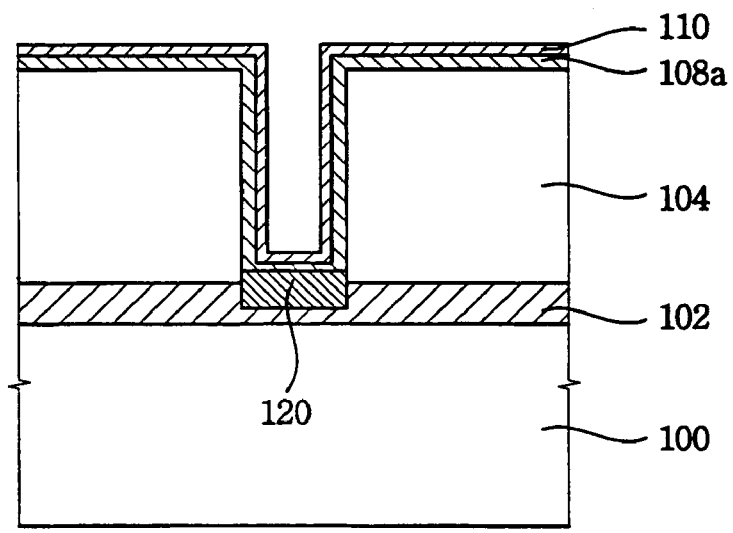

Referring to FIG. 2D, the silicon substrate 100 was primarily thermally treated in an atmosphere having a temperature in a range from of about 400° C. to about 500° C. for a sufficient time, such as 90 seconds, to form a first cobalt silicide layer 120 on the exposed polysilicon layer 102.

Figure 2E:
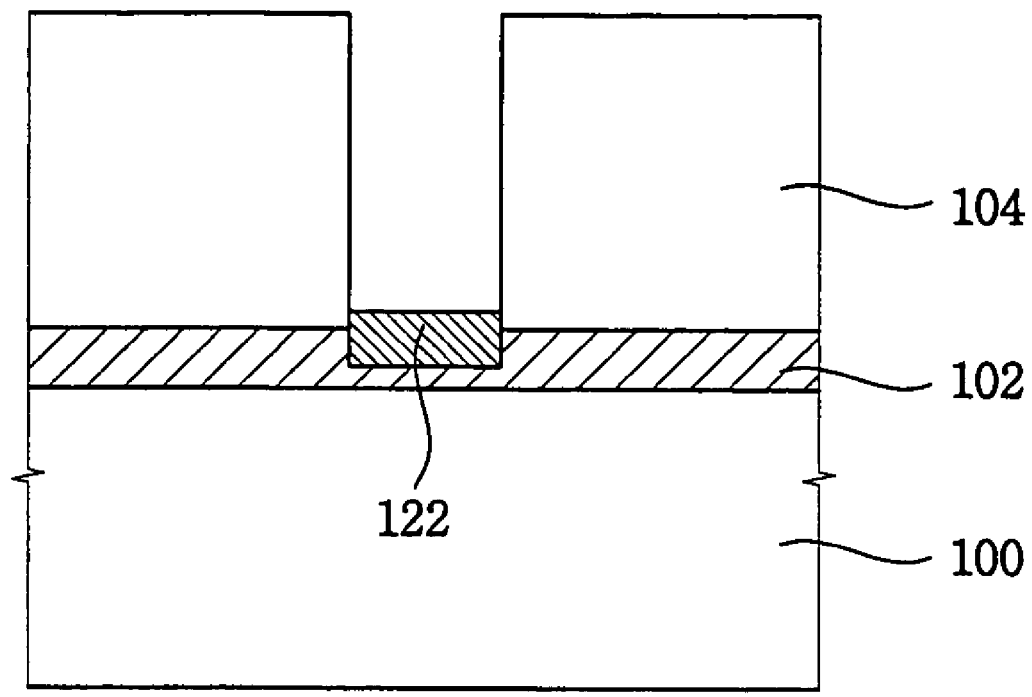

Referring to FIG. 2E, the remaining titanium layer 112 and the cobalt layer 108 were removed by a wet etching process. The silicon substrate 100 was secondarily thermally treated in an atmosphere having a temperature in a range of about 800° C. to about 900° C. for a sufficient time, such as 30 seconds, to transform the first cobalt silicide layer 120 into a second cobalt silicide layer 122.

According to the present example, the second cobalt silicide layer 122 was formed on the bottom face of the contact hole 106 so that a contact resistance was reduced. Therefore, an ohmic contact was formed in the contact hole 106 by a subsequent process.

In this process, the method of forming the second cobalt silicide layer was employed in the contact hole contacting with the polysilicon layer. Additionally, the method of forming the second cobalt silicide layer could be employed in a contact formation region having a silicon surface.

COMPARATIVE EXAMPLE 1

A gate structure having a gate insulation layer pattern and a polysilicon layer pattern was formed on a substrate. Source/drain regions were formed at surface portions of the substrate that were positioned at both sides of the gate structure. A silicon nitride spacer was formed on a sidewall of the gate structure.

A cobalt layer was formed on the substrate and the gate structure by a CVD process. A titanium nitride layer was then formed on the cobalt layer.

The substrate was primarily thermally treated in an atmosphere having a temperature in a range of about 400° C. to about 500° C. for a sufficient time, such as 90 seconds. The remaining titanium nitride layer and un-reacted cobalt was removed by a wet etching process. The substrate was secondarily thermally treated at a temperature of about 800° C. to about 900° C. for 30 seconds to form a cobalt silicide layer.

COMPARATIVE EXAMPLE 2

A gate structure having a gate insulation layer pattern and a polysilicon layer pattern was formed on a substrate. Source/drain regions were formed surface portions of the substrate that were positioned at both sides of the gate structure. A silicon nitride spacer was then formed on a sidewall of the gate structure.

A cobalt layer was formed on the substrate and the gate structure by a PVD process. A titanium nitride layer was then formed on the cobalt layer.

The substrate was primarily thermally treated in an atmosphere having a temperature in a range of about 400° C. to about 500° C. for a sufficient time, such as 90 seconds. The remaining titanium nitride layer and the cobalt layer was removed by a wet etching process. The substrate was secondarily thermally treated in an atmosphere having a temperature in a range of about 800° C. to about 900° C. for a sufficient time, such as 30 seconds, to form a cobalt silicide layer.

COMPARATIVE EXPERIMENT 1

Figure 3:
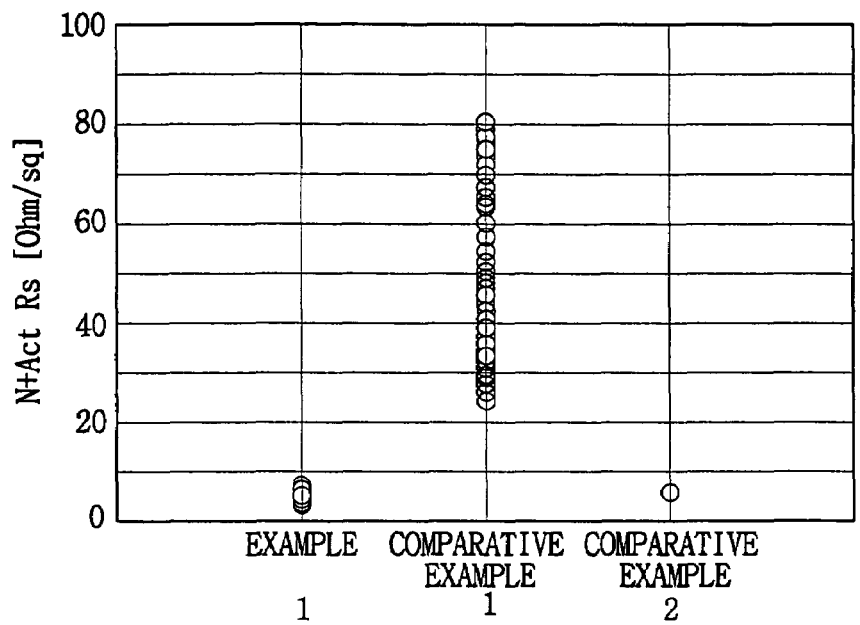
FIG. 3 presents a graph showing sheet resistances of cobalt silicide layers in active regions that are doped with N type impurities, after N type MOS transistors are formed using the method of Example 1 and methods of Comparative Examples 1 and 2, respectively.

FIG. 3 presents a graph showing sheet resistances of cobalt silicide layers in active regions that are doped with N type impurities, after N type MOS transistors were formed using the method of Example 1 and methods of Comparative Example 1 and 2, respectively. The active region had a width of about 120 nm.

Referring to FIG. 3, when the cobalt silicide layer was formed by the CVD process in Comparative Example 1, the cobalt silicide layer formed in the N type active region had a relatively high sheet resistance of about 44.6 Ω/sq. Also, the sheet resistance of the cobalt silicide layer had a wide distribution.

When the cobalt silicide layer was formed by the PVD process in Comparative Example 2, the cobalt silicide layer formed in the N type active region had a sheet resistance of about 6.5 Ω/sq. Since the cobalt silicide layer was formed from the cobalt layer having fewer impurities by the PVD process, the cobalt silicide layer had a low sheet resistance.

On the contrary, when the cobalt silicide layer was formed using the method in accordance with Example 1, the cobalt silicide layer formed in the N type active region had a sheet resistance of about 4.5 Ω/sq. Also, the sheet resistance of the cobalt silicide layer had a distribution narrower than that of the cobalt silicide layer formed by the CVD process.

The cobalt silicide layer formed using method in accordance with Example 1 had improved step coverage so that the cobalt silicide layer having a uniform thickness could be formed on an irregular pattern. Further, the cobalt silicide layer formed using the methods in accordance with Example 1 had a sheet resistance substantially similar to that of the cobalt silicide layer formed by the PVD process in Comparative Example 2.

COMPARATIVE EXPERIMENT 2

Figure 4:
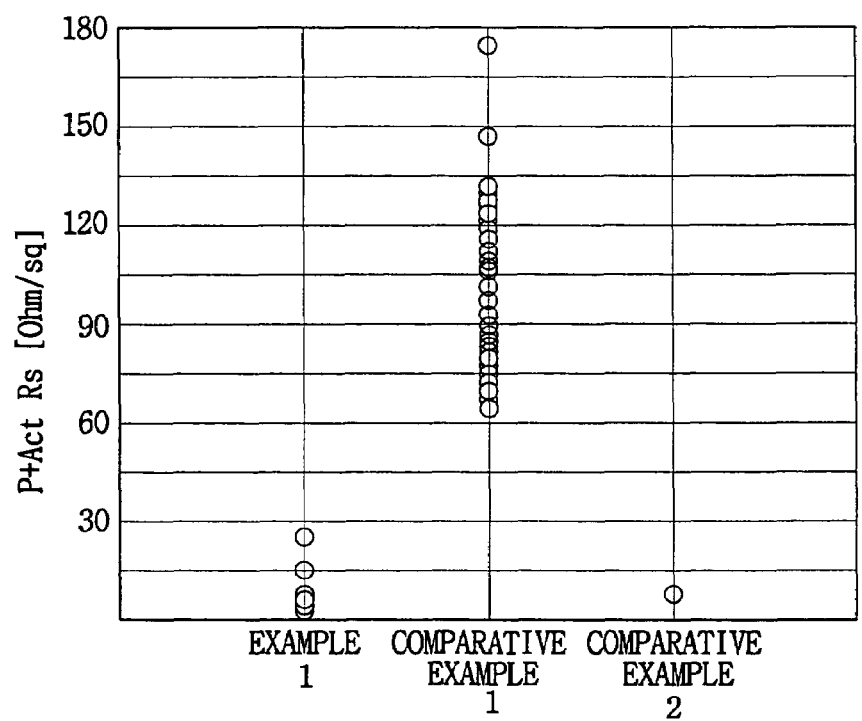
FIG. 4 presents a graph showing sheet resistances of cobalt silicide layers in active regions that are doped with P type impurities, after P type MOS transistors are formed using the method of Example 1 and methods of Comparative Examples 1 and 2, respectively.

FIG. 4 presents a graph showing sheet resistances of cobalt silicide layers in active regions that are doped with P type impurities, after P type MOS transistors were formed using the method of Example 1 and methods of Comparative Examples 1 and 2, respectively. The active region had a width of about 120 nm.

Referring to FIG. 4, when the cobalt silicide layer was formed by the CVD process in Comparative Example 1, the cobalt silicide layer formed in the P type active region had a relatively high sheet resistance of about 97.0 Ω/sq. Also, the sheet resistance of the cobalt silicide layer had a wide distribution.

When the cobalt silicide layer was formed by the PVD process in Comparative Example 2, the cobalt silicide layer formed in the P type active region had a sheet resistance of about 7.2 Ω/sq.

On the contrary, when the cobalt silicide layer was formed using the method in accordance with Example 1, the cobalt silicide layer formed in the P type active region had a sheet resistance of about 5.7 Ω/sq. Also, the sheet resistance of the cobalt silicide layer had a distribution narrower than that of the cobalt silicide layer formed by the CVD process.

The cobalt silicide layer formed using the method in accordance with Example 1 had a sheet resistance substantially similar to that of the cobalt silicide layer formed by the PVD process in Comparative Example 2.

COMPARATIVE EXPERIMENT 3

Figure 5:
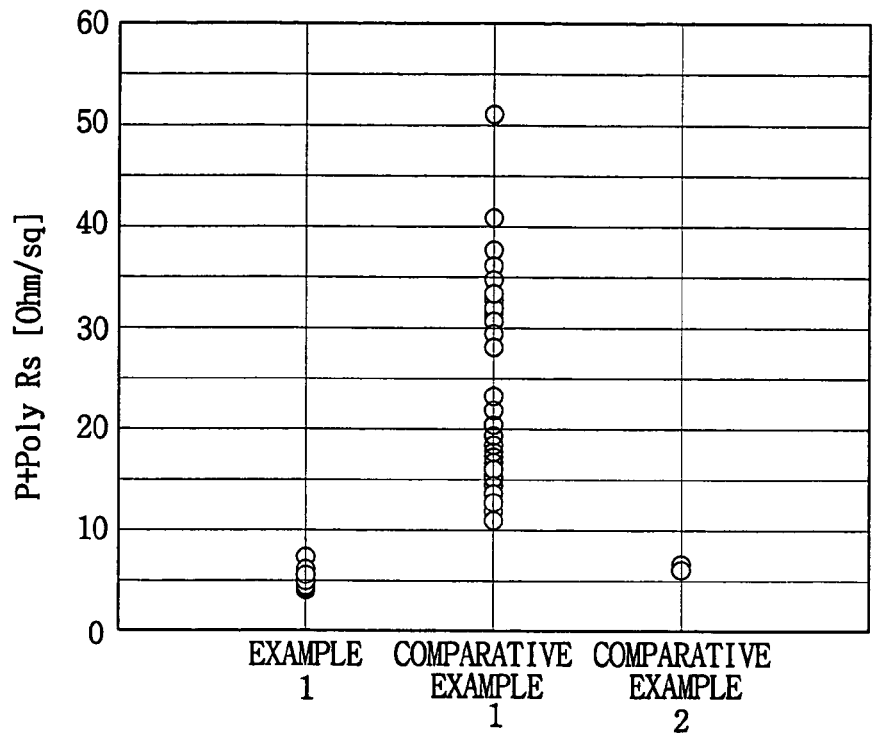
FIG. 5 presents a graph showing sheet resistances of cobalt silicide layers on gate structures that are doped with N type impurities, after N type MOS transistors are formed using the method of Example 1 and methods of Comparative Examples 1 and 2, respectively.

FIG. 5 presents a graph showing sheet resistances of cobalt silicide layers on gate structures that are doped with N type impurities, after N type MOS transistors were formed using the method of Example 1 and methods of Comparative Examples 1 and 2, respectively. The gate structure had a thickness of about 1,500 Å and a length of about 92 nm.

Referring to FIG. 5, when the cobalt silicide layer was formed by the CVD process in Comparative Example 1, the cobalt silicide layer formed on the gate structure had a relatively high sheet resistance of about 23.3 Ω/sq. Also, the sheet resistance of the cobalt silicide layer had a wide distribution.

When the cobalt silicide layer was formed by the PVD process in Comparative Example 2, the cobalt silicide layer formed on the gate structure had a sheet resistance of about 6.8 Ω/sq.

On the contrary, when the cobalt silicide layer was formed using the method in accordance with Example 1, the cobalt silicide layer formed on the gate structure had a sheet resistance of about 3.6 Ω/sq. Also, the sheet resistance of the cobalt silicide layer had a distribution narrower than that of the cobalt silicide layer formed by the CVD process.

COMPARATIVE EXPERIMENT 4

Figure 6:
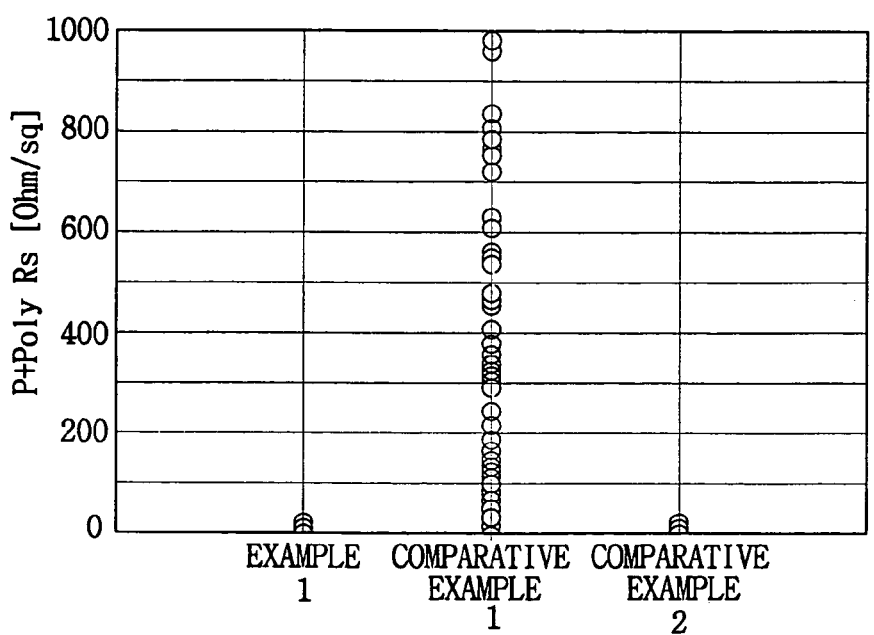
FIG. 6 presents a graph showing sheet resistances of cobalt silicide layers on gate structures that are doped with P type impurities, after P type MOS transistors are formed using the method of Example 1 and methods of Comparative Examples 1 and 2, respectively.

FIG. 6 presents a graph showing sheet resistances of cobalt silicide layers on gate structures that are doped with P type impurities, after P type MOS transistors were formed using the method of Example I and methods of Comparative Examples 1 and 2, respectively. The gate structure had a thickness of about 1,500 Å and a length of about 92 nm.

Referring to FIG. 6, when the cobalt silicide layer was formed by the CVD process in Comparative Example 1, the cobalt silicide layer formed on the gate structure had a relatively high sheet resistance of about 241.0 Ω/sq. Also, the sheet resistance of the cobalt silicide layer had a wide distribution.

When the cobalt silicide layer was formed by the PVD process in Comparative Example 2, the cobalt silicide layer formed on the gate structure had a sheet resistance of about 7.6 Ω/sq.

On the contrary, when the cobalt silicide layer was formed using the method in accordance with Example 1, the cobalt silicide layer formed on the gate structure had a sheet resistance of about 3.2 Ω/sq. Also, the sheet resistance of the cobalt silicide layer had a distribution narrower than that of the cobalt silicide layer formed by the CVD process.

The cobalt silicide layer formed using the method in accordance with Example 1 had a low sheet resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a cobalt silicide layer comprising:
    forming a nitride spacer on a sidewall of the gate structure;
    forming a source/drain regions at surface portions of the silicon substrate that are positioned at both sides of the gate structure;
    forming a gate structure including a gate oxide layer pattern and a polysilicon layer pattern on a silicon substrate;
    introducing a vaporized cobalt precursor having a formula $Co_2(CO)_6(R^1—C\equiv R^2)$, wherein $R^1$ is H or $CH_3$, and $R^2$ is H, t-butyl, methyl or ethyl, onto the silicon substrate as a source gas to form a cobalt layer on the silicon substrate, wherein the vaporized cobalt precursor is physisorbed and chemisorbed on the silicon substrate and a purge gas is introduced to separate the silicon substrate thereby providing a cobalt layer on the silicon substrate;
    forming a titanium layer on the cobalt layer; and
    thermally treating the silicon substrate to react silicon with cobalt to form the cobalt silicide ($CoSi_2$) layer, wherein the method is repeatedly performed to provide a cobalt layer having a desired thickness on the silicon substrate.

2. The method of claim 1, wherein the titanium layer is formed by a chemical vapor deposition (CVD) process, an atomic layer deposition (ALD) process or a physical vapor deposition (PVD) process.

3. The method of claim 1, wherein the titanium layer has a thickness of at least about 5 Å.

4. The method of claim 1, further comprising forming a titanium nitride layer on the titanium layer.

5. The method of claim 4, wherein the titanium nitride layer has a thickness of at least about 100 Å.

6. The method of claim 1, wherein the cobalt precursor comprises $Co_2(CO)_6$:(HC≡CtBu), $Co(MeCp)_2$, $Co(CO)_3$(NO), $Co(CO)_2Cp$, $CoCp_2$, $Co_2(CO)_6$:(HC≡CPh), $Co_2(CO)_6$:(HC≡CH), $Co_2(CO)_6$:(HC≡CCH_3$), $Co_2(CO)_6$:($CH_3C\equiv CCH_3$) or a mixture thereof.

7. A method of forming a cobalt silicide layer comprising:
    introducing a vaporized cobalt precursor comprising dicobalt hexacarbonyl t-butyl acetylene onto a silicon substrate as a source gas to form a cobalt layer on the silicon substrate;
    forming a titanium layer on the cobalt layer; and
    thermally treating the silicon substrate to react silicon with cobalt to form the cobalt silicide ($CoSi_2$) layer.

8. The method of claim 1, wherein the substrate is thermally treated in a furnace or by a rapid thermal process (RTP).

9. The method of claim 1, wherein thermally treating the silicon substrate comprises:
    performing a first thermal treatment of the substrate in an atmosphere having a temperature in a range of about 300° C. to about 600° C. to convert the cobalt layer into an initial cobalt silicide layer by partially reacting silicon and cobalt; and
    removing the titanium layer and un-reacted cobalt remaining on the silicon substrate.

10. The method of claim 1 further comprising performing a second thermal treatment of the silicon substrate in an atmosphere having a temperature in a range of about 700° C. to about 1,000° C. to form a final cobalt silicide layer.

11. The method of claim 10, wherein the final cobalt silicide layer has a low resistance, improved stability and/or improved step coverage relative to the initial cobalt silicide layer.

12. The method of claim 1, wherein the silicon substrate is exposed to thermal treatment in an atmosphere having a temperature in a range of about 300° C. to about 1,000° C.

13. The method of claim 1, wherein the cobalt layer is formed by a CVD process or an ALD process.

14. The method of claim 1, further comprising forming source/drain regions at surface portions on the silicon substrate prior to introducing the cobalt precursor.

15. The method of claim 1, wherein formation of an oxide layer at an interface between the silicon substrate and the cobalt silicide layer is suppressed.

16. A method of forming a cobalt silicide layer comprising:
introducing a vaporized cobalt precursor having a formula $Co_2(CO)_6(R_1-C\equiv C-R^2)$, wherein $R^1$ is H or $CH_3$, and $R^2$ is H, t-butyl, methyl or ethyl onto a silicon substrate as a source gas to form a cobalt layer on the silicon substrate;
forming a titanium layer on the cobalt layer; and
thermally treating the silicon substrate to react silicon with cobalt to form the cobalt silicide ($CoSi_2$) layer, wherein a native oxide layer is naturally formed on the silicon substrate while forming the cobalt layer, and titanium in the titanium layer diffuses into the native oxide layer while thermally treating the silicon substrate.

17. The method of claim 1, wherein the silicon substrate is located on a semiconductor device.

18. A method for manufacturing a semiconductor device comprising:
forming a polysilicon layer on a silicon substrate;
forming an insulating interlayer on the polysilicon layer;
etching the insulating interlayer to form a contact hole partially exposing the polysilicon layer, wherein the contact hole is cleaned using a plasma treatment comprising hydrogen gas;
introducing a vaporized cobalt precursor having a formula $Co_2(CO)_6(R^1-C\equiv C-R^2)$, wherein $R^1$ is H or $CH_3$, and $R^2$ is H, t-butyl, methyl or ethyl, onto the silicon substrate to form a cobalt layer on a native oxide layer that is naturally formed on the silicon substrate;
forming a titanium layer on the cobalt layer; and
thermally treating the silicon substrate to diffuse titanium into the silicon substrate and the cobalt silicide layer.

19. The method of claim 7, wherein the method is performed at least once to provide a cobalt layer having a desired thickness on the silicon substrate.

20. The method of claim 7 further comprising forming a titanium nitride layer on the titanium layer.

21. The method of claim 16, wherein the method is performed at least once to provide a cobalt layer having a desired thickness on the silicon substrate.

22. The method of claim 16 further comprising forming a titanium nitride layer on the titanium layer.

* * * * *